United States Patent
Badger

(10) Patent No.: US 11,593,288 B2
(45) Date of Patent: Feb. 28, 2023

(54) METHODS AND APPARATUS FOR FABRIC INTERFACE POLLING

(71) Applicant: GigaIO Networks, Inc., Carlsbad, CA (US)

(72) Inventor: Eric Badger, Carlsbad, CA (US)

(73) Assignee: GigaIO Networks, Inc., Carlsbad, CA (US)

(*) Notice: Subject to any disclaimer, the term of this patent is extended or adjusted under 35 U.S.C. 154(b) by 94 days.

(21) Appl. No.: 17/061,366

(22) Filed: Oct. 1, 2020

(65) Prior Publication Data

US 2021/0103535 A1    Apr. 8, 2021

Related U.S. Application Data

(60) Provisional application No. 62/909,629, filed on Oct. 2, 2019.

(51) Int. Cl.
*G06F 13/22* (2006.01)
*G06F 13/40* (2006.01)
(Continued)

(52) U.S. Cl.
CPC .......... *G06F 13/22* (2013.01); *G06F 13/1673* (2013.01); *G06F 13/4027* (2013.01); *G06F 30/331* (2020.01); *G06F 2213/0026* (2013.01)

(58) Field of Classification Search
CPC .. G06F 13/22; G06F 13/1673; G06F 13/4027; G06F 30/331
See application file for complete search history.

(56) References Cited

U.S. PATENT DOCUMENTS 6,721,316 B1    4/2004  Epps et al.
8,037,345 B1    10/2011 Iyer et al.
(Continued)

FOREIGN PATENT DOCUMENTS

CN    100401709 C    7/2008
CN    102196503 A    9/2011
(Continued)

OTHER PUBLICATIONS

Dittia Z., et al., "DMA Mechanisms for High Performance Network Interfaces," 2007, [Retrieved from Internet] (URL:https://www.semanticscholar.org/paper/DMA-Mechanisms-for-High-Performance-Network-Dittia-Cox/23fae6a2d6ce3ce922fc8571e0ada0519ffe8057).
(Continued)

*Primary Examiner* — Henry Tsai
*Assistant Examiner* — Christopher A Daley
(74) *Attorney, Agent, or Firm* — Patent Beach PC

(57) ABSTRACT

Methods and apparatus for efficient data transmit and receive operations using polling of memory queues associated with interconnect fabric interface. In one embodiment, Non-Transparent Bridge (NTB) technology used to transact the data transmit/receive operations and a hardware accelerator card used implement a notification mechanism in order to optimize of receive queue polling are disclosed. The accelerator card comprises a notification address configured to signal the presence of data, and a notification acknowledgement region configured to store flags associated with memory receive queues. In one implementation, the interconnect fabric is based on PCIe technology, including up to very large fabrics and numbers of hosts/devices for use in ultra-high performance applications such as for example data centers and computing clusters.

22 Claims, 8 Drawing Sheets

(51) Int. Cl.
*G06F 30/331* (2020.01)
*G06F 13/16* (2006.01)

(56) References Cited

U.S. PATENT DOCUMENTS

| | | | |
|---|---|---|---|
| 8,271,996 B1 | 9/2012 | Gould et al. | |
| 8,463,934 B2 | 6/2013 | Maitra | |
| 8,868,777 B2 | 10/2014 | Maitra | |
| 8,949,483 B1 | 2/2015 | Martin | |
| 9,152,597 B2 | 10/2015 | Maitra | |
| 9,448,957 B2 | 9/2016 | Maitra | |
| 9,626,324 B2 | 4/2017 | Chawla et al. | |
| 10,756,816 B1* | 8/2020 | Dreier | G06F 3/0659 |
| 2004/0125804 A1 | 7/2004 | Lee | |
| 2006/0174251 A1 | 8/2006 | Pope et al. | |
| 2006/0282603 A1 | 12/2006 | Onufryk et al. | |
| 2006/0288129 A1 | 12/2006 | Pope et al. | |
| 2008/0010648 A1 | 1/2008 | Ando et al. | |
| 2008/0186917 A1 | 8/2008 | Wu et al. | |
| 2009/0077277 A1 | 3/2009 | Vidal et al. | |
| 2009/0125666 A1 | 5/2009 | Freking et al. | |
| 2009/0240874 A1 | 9/2009 | Pong | |
| 2009/0248947 A1 | 10/2009 | Malwankar et al. | |
| 2012/0033680 A1 | 2/2012 | Gopinath et al. | |
| 2012/0281536 A1* | 11/2012 | Gell | H04W 28/18 370/235 |
| 2013/0212165 A1 | 8/2013 | Vermeulen et al. | |
| 2013/0290967 A1 | 10/2013 | Calciu et al. | |
| 2014/0181454 A1 | 6/2014 | Manula et al. | |
| 2014/0344947 A1 | 11/2014 | Kalyanasundharam et al. | |
| 2014/0372657 A1 | 12/2014 | Jones et al. | |
| 2015/0026384 A1 | 1/2015 | Maitra | |
| 2015/0261709 A1 | 9/2015 | Billi | |
| 2017/0070363 A1* | 3/2017 | Watkins | H04L 69/32 |
| 2018/0095914 A1* | 4/2018 | Kondiles | G06F 16/2365 |
| 2018/0247187 A1 | 8/2018 | Chung et al. | |
| 2018/0341619 A1 | 11/2018 | Slik | |
| 2019/0163378 A1* | 5/2019 | Carlough | G06F 13/1673 |
| 2020/0081858 A1 | 3/2020 | Philmore et al. | |
| 2020/0117676 A1* | 4/2020 | Ben Moshe | G06F 16/2455 |
| 2020/0117844 A1* | 4/2020 | Choi | G06F 30/343 |
| 2020/0310994 A1* | 10/2020 | ChoFleming | G06F 12/0857 |
| 2021/0073158 A1 | 3/2021 | Badger | |
| 2021/0075745 A1 | 3/2021 | Badger | |
| 2021/0124706 A1 | 4/2021 | Meyer | |

FOREIGN PATENT DOCUMENTS

| | | |
|---|---|---|
| CN | 103353851 A | 10/2013 |
| CN | 106850803 A | 6/2017 |
| CN | 112579263 A | 3/2021 |
| EP | 3850493 A1 | 7/2021 |
| JP | 3809674 B2 | 8/2006 |
| WO | WO-2008157470 A1 | 12/2008 |
| WO | WO-2020055921 A1 | 5/2020 |
| WO | WO-2021050762 A1 | 3/2021 |
| WO | WO-2021050763 A1 | 3/2021 |
| WO | WO-2021067818 A2 | 4/2021 |
| WO | WO-2021081409 A1 | 4/2021 |

OTHER PUBLICATIONS

Buntinas D., et al., "Implementation and Evaluation of Shared-Memory Communication and Synchronization Operations in MPICH2 using the Nemesis Communication Subsystem," Parallel Computing, Jun. 2007, pp. 1-17. URL: <url: https://www.mcs.anl.gov/uploads/cels/papers/P1346A.pdf</url: <a>.

Kristiansen, Lars, PCIe Device Lending; Using Non-Transparent Bridges to Share Devices, Master's Thesis Spring 2015, UiO Department of Informatics, University of Oslo.

PCI Express Base Specification Version 1.0a, 2003.
PCI Express Base Specification Version 1.1 dated Mar. 8, 2005.
PCI Express Base Specification Version 2.0 dated Dec. 20, 2006.
PCI Express Base Specification Version 2.1 dated Mar. 4, 2009.
PCI Express Base Specification Version 3.0 dated Oct. 23, 2014.
PCI Express Base Specification Version 3.1 dated Dec. 7, 2015.
PCI Express Base Specification Version 5.0 dated Jun. 5, 2018.
PCI Express Base Specification Revision 4.0 dated Oct. 5, 2017.

Shipman G. M., et al., "Investigations on InfiniBand: Efficient Network Buffer Utilization at Scale," Investigations on InfiniBand, 2007, pp. 178-186. URL: <url: http://citeseerx.ist.psu.edu/viewdoc/download?doi=10.1.1.89.3001&rep=rep1type=pdf</url: <a>.

Tu C., et al., "Marlin: A Memory-Based Rack Area Network," IEEE Xplore, 2014, 11 pages.

Yu, W., et al., "Adaptive Connection Management for Scalable MPI over InfiniBand," IEEE Xplore, Jun. 2006, pp. 1-10. URL: <url: https://ieeexplore.ieee.org/document/1639338</url: <a>.

* cited by examiner

METHODS AND APPARATUS FOR FABRIC INTERFACE POLLING

PRIORITY AND RELATED APPLICATIONS

This application claims priority to co-owned and co-pending U.S. Provisional Patent Application Ser. No. 62/909,629 filed Oct. 2, 2019 and entitled "METHODS AND APPARATUS FOR FABRIC INTERFACE POLLING," which is incorporated herein by reference in its entirety.

This application is generally related to the subject matter of co-pending U.S. patent application Ser. No. 17/016,269 filed Sep. 9, 2020 and entitled METHODS AND APPARATUS FOR IMPROVED POLLING EFFICIENCY IN NETWORK INTERFACE FABRICS, which claims the benefit of priority to U.S. Provisional Patent Application Ser. No. 62/898,489 filed Sep. 10, 2019 and entitled "METHODS AND APPARATUS FOR NETWORK INTERFACE FABRIC SEND/RECEIVE OPERATIONS", and U.S. Provisional Patent Application Ser. No. 62/909,629 filed on Oct. 10, 2019 entitled "Methods and Apparatus for Fabric Interface Polling", each of which is incorporated herein by reference in its entirety.

This application is also generally related to the subject matter of U.S. patent application Ser. No. 16/566,829 filed on Sep. 10, 2019 and entitled "METHODS AND APPARATUS FOR HIGH-SPEED DATA BUS CONNECTION AND FABRIC MANAGEMENT," and U.S. patent application Ser. No. 17/016,228 filed Sep. 9, 2020 and entitled "METHODS AND APPARATUS FOR NETWORK INTERFACE FABRIC SEND/RECEIVE OPERATIONS," which claims priority to U.S. Provisional Patent Application Ser. No. 62/898,489 filed Sep. 10, 2019 of the same title, each of which is incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND

1. Technological Field

The present disclosure relates generally to the field of data buses, interconnects and networking and specifically, in one or more exemplary embodiments, to methods and apparatus for providing improved fabric interface polling.

2. Description of Related Technology

PCIe fabric is composed of point-to-point links that interconnect a set of components. A single fabric instance (hierarchy) includes only one root port/complex (connected to the host/processor device and the host memory) and multiple endpoints (connected to peripheral devices). Thus, normally, PCIe fabric does not allow communication between multiple root devices. However, PCIe NTBs (non-transparent bridges) can virtually allow TLPs (transaction layer packets) to be translated between multiple roots. Using NTBs, roots can communicate with one another because each root views the other as a device (subject to certain limitations).

Interconnect fabric architectures such as those based in non-transparent bridges (NTBs) and PCIe technology use message-style communication, which entails a data movement step and a synchronization step.

NTB based fabric can perform data movement (i.e., send/receive operations) between multiple hosts/processors using simple read or write processes. For example, in order for a host/processor to send a message to a remote/external host through NTB-based fabric, an NTB writes the message to the memory of that remote host (e.g. to a special "receive queue" memory region of the remote host).

The data (message) shows up in a receive queue part of remote host memory, but a synchronization step is required for the data to be received by the remote host. In other words, the remote host does not realize the message is present unless it receives a notification and/or until it actively looks for it (e.g., polls its receive queues). The receive-side synchronization step may be achieved with an interrupt process (e.g., by writing directly to an MSI-X interrupt address); however, using interrupts may contribute to high latency, especially for processes that are user-space based (as opposed to kernel-space based).

In order to attain lower latency in user-space processes, interconnect fabrics can instead use receive queue polling, where a receiving node periodically scans all the receive queues of the receiving node, in order to determine whether it has any messages. However, as interconnect fabric size expands (and a given user's or device's set of communication partners grows), the number of receive queues grows, and the individual polling of the large number of receive queues becomes a potential bottleneck or even impractical at very large sizes. A queue pair send/receive mechanism should ideally perform within certain metrics (e.g., a very low latency, such as on the order of 1-2 microseconds or less in some exemplary applications), even as the number of queues grows. These performance requirements become untenable using prior art methods, especially as the fabric size grows large.

Accordingly, based on the foregoing, there is a need for improved methods and apparatus that enable, inter alia, efficient and effective polling of large numbers of receive queues.

SUMMARY

The present disclosure satisfies the foregoing needs by providing, inter alia, methods and apparatus for improved fabric operation and configuration, including for polling operations.

In one aspect of the disclosure, a mechanism to improve performance of receive queue polling by user processes is disclosed. In one embodiment, the polling is performed on a plurality of receive queues (memory locations) located in RAM of a receiving node/host. In one variant, the mechanism is implemented in hardware on an accelerator card using a field programmable gate array (FPGA), and includes a notification address, a notification ring buffer, and a notification acknowledgement mechanism. In one implementation, the notification address is configured be written to across the fabric and to signal the availability of data (e.g., using message signal interrupts (MSIs), similar to an MSIX address).The notification address may be e.g., located within the accelerator card BAR (base address register).

In one embodiment, the aforementioned notification ring buffer is an address space located in RAM (random access memory) of the receiving node/host. The notification ring buffer is configured in one variant to be read by the polling function (the poller) of the receiving host and written to by the hardware/accelerator card that records unacknowledged notifications. In one implementation, the notification acknowledgement mechanism includes an array of acknowledgement flags associated with receive queues of the receiving node and configured to indicate whether a particular receive queue has data.

In one configuration, individual receive queues have associated index or ID numbers; the notification ring buffer is configured to store one or more receive queue index/ID numbers, and the notification address is configured to signal availability of data on a particular receive queue in response to having the receive queue ID number of the particular receive queue written onto it.

In another aspect of the disclosure, a method of transmitting data messages from a host device to another/external/remote host device using interconnect fabric (e.g., through a NTB) is disclosed. In one embodiment, the method includes transmitting data to a NTB and using the NTB to write data into a memory of the external host.

In one variant, the memory includes one or more memory receive queues located in RAM of the external host, and the the method includes writing an index (or ID/name/reference/etc) of the memory queue(s) into a notification address space. In one variant, the notification address is configured to signal the availability of data (located on it).

In another variant, the notification address is located in BAR of an accelerator card associated with the external host.

In another embodiment, the method includes, upon receiving a write to the notification address, examining a portion of a notification acknowledgement region associated with the index. In one variant, the notification acknowledgement region comprises an array of notification acknowledgement flags associated with the receive queues of the external host device. In another variant, each flag corresponds to one receive queue. In yet a further variant, one or more flags can be associated with multiple receive queues.

In another embodiment, the method includes determining whether the flag of the index is 1 or 0 (up or down). In one variant, in response to a determination that the flag of the index is 1, taking no action. In another variant, in response to a determination that the flag of the index is 0, changing the flag to 1 and writing an entry (the index) into a notification ring buffer. The notification ring buffer may be located in RAM of the external host device and be configured to be written to by the hardware accelerator card and to be read by a polling mechanism of the external host device.

In a further aspect of the disclosure, a method of receiving data from an interconnect fabric using polling of one or more receive queues is disclosed. In a further aspect, computer-readable apparatus with a storage medium is disclosed. In one embodiment, the medium includes executable instructions configured to, when executed on a processor: write data to a receive queue; write a number (or index, ID, address, name, reference, etc.) associated with the receive queue to a notification address; access a notification ring buffer and determine whether the number of the receive queue is flagged; upon a determination that the number of the receive queue is flagged, do nothing (end process); and upon a determination that the number of the receive queue is not flagged, flag it.

In a further aspect of the disclosure, computer-readable apparatus configured for use with a notification mechanism within an interconnect fabric is disclosed. In one embodiment, the apparatus includes a storage medium including executable instructions configured to, when executed on a processor: at least periodically check a notification ring buffer for new entries; read out queue indexes found on the notification ring buffer; in response to finding a new entry, scan a memory receive queue associated with the index and process all messages present on the memory receive queue; clear the entry from the notification ring buffer; clear a notification acknowledgement flag for the just-processed receive queue; and continue reading out and clearing the queue indexes on the notification ring buffer until the notification ring buffer is empty.

A hardware implemented notification mechanism including a notification address and a notification acknowledgement region is further disclosed. In one embodiment, the notification address is an MSI-X type address, configured to signal the availability of data in response to being written to. In one embodiment, the notification acknowledgement region is an array of flags, each flag corresponding to one or more receive queues.

A computer readable memory device including one or more memory/address spaces configured at least one receive queue and one or more memory spaces configured as at least one notification ring buffer is also disclosed. In one embodiment, the memory device is a RAM device. The notification ring buffer is configured to receive In yet another aspect, a method of optimizing memory queue polling is disclosed.

In a further aspect, a method of performing asynchronous read/write operations is disclosed.

In still another aspect, an interconnect fabric device (e.g., including one or more NTBs) configured to transmit data from one node to another node using data read and write processes is disclosed.

In a further aspect, a method of improved read/write operations using receive queue polling, including creating an IO mapping an array of queue flags is disclosed. In one embodiment, each flag corresponds to one receive queue. In another embodiment, one or more flags corresponds to multiple receive queues.

In another aspect, a method of memory receive queue polling including separating receive (RX) queues into tiered sets is disclosed. In one embodiment, the sets are: hot, warm, and cold. In another embodiment, the sets are dynamically changed according to set parameters. In one variant, the set parameters are static and predetermined. In another variant, the set parameters are tunable and are changed to maintain performance of the sets.

In a further aspect of the disclosure, an accelerator card is disclosed. In one embodiment, the accelerator card includes a processor or FPGA, memory, and one or more data interfaces.

These and other aspects shall become apparent when considered in light of the disclosure provided herein.

Figure 1:
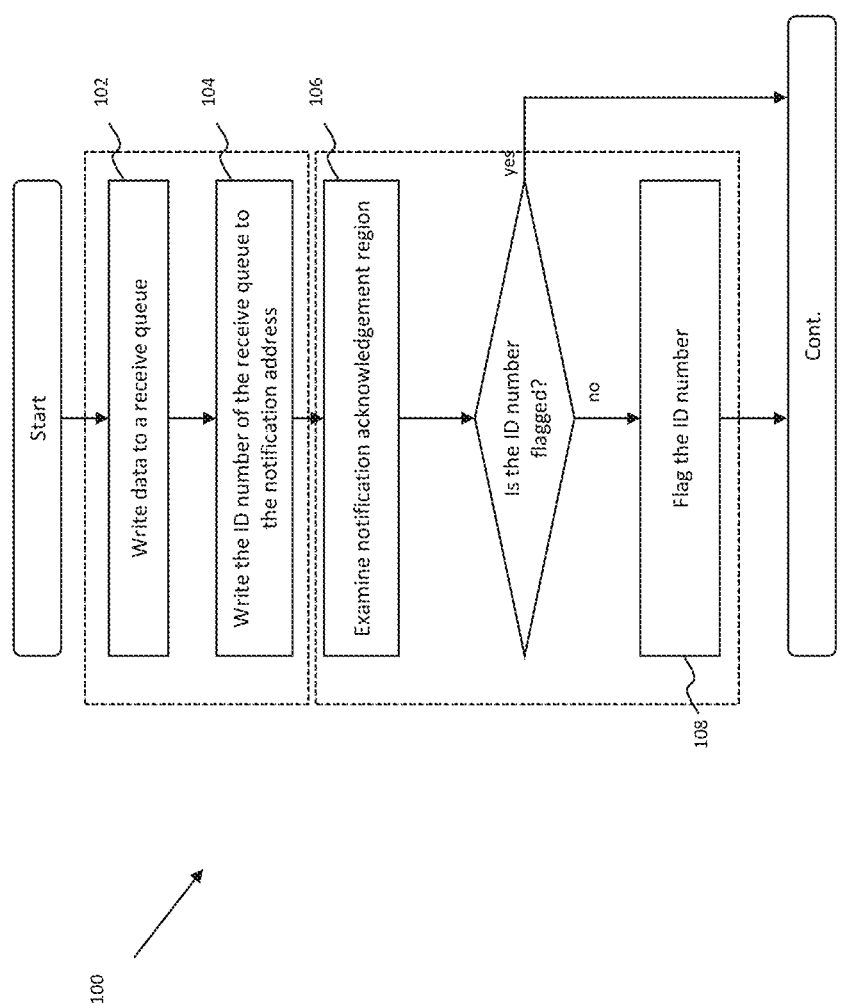
FIG. 1 is a logical flow diagram illustrating one embodiment of a transmit and notification process performed through an interconnect fabric, in accordance with aspects of the present disclosure.

All figures disclosed herein in are © Copyright 2019-2020 GigaIO, Inc. All rights reserved.

DETAILED DESCRIPTION

Reference is now made to the drawings wherein like numerals refer to like parts throughout.

As used herein, the term "computer program" or "software" is meant to include any sequence or human or machine cognizable steps which perform a function. Such program may be rendered in virtually any programming language or environment including, for example, C/C++, Fortran, COBOL, PASCAL, Ruby, Python, assembly language, markup languages (e.g., HTML, SGML, XML, VoXML), and the like, as well as object-oriented environments such as the Common Object Request Broker Architecture (CORBA), Java™ (including J2ME, Java Beans, etc.) and the like.

As used herein, the terms "device" or "host device" include, but are not limited to, servers or server farms, set-top boxes (e.g., DSTBs), gateways, modems, personal computers (PCs), and minicomputers, whether desktop, laptop, or otherwise, as well as mobile devices such as handheld computers, GPUs (including GPU-based devices such as accelerator cards or GPU-based supercomputers), PDAs, personal media devices (PMDs), tablets, "phablets", smartphones, vehicle infotainment systems or portions thereof, distributed computing systems, VR and AR systems, gaming systems, or any other computerized device.

As used herein, the term "memory" includes any type of integrated circuit or other storage device adapted for storing digital data including, without limitation, ROM, PROM, EEPROM, DRAM, SDRAM, DDR/2/3/4/5/6 SDRAM, EDO/FPMS, RLDRAM, SRAM, "flash" memory (e.g., NAND/NOR), 3D memory, HBM/HBM2, and PSRAM.

As used herein, the terms "microprocessor" and "processor" or "digital processor" are meant generally to include all types of digital processing devices including, without limitation, digital signal processors (DSPs), reduced instruction set computers (RISC), general-purpose (CISC) processors, GPUs (graphics processing units), microprocessors, gate arrays (e.g., FPGAs), PLDs, reconfigurable computer fabrics (RCFs), array processors, secure microprocessors, and application-specific integrated circuits (ASICs). Such digital processors may be contained on a single unitary IC die, or distributed across multiple components.

As used herein, the term "network interface" refers to any signal or data interface with a component or network including, without limitation, those of the PCIe, FireWire (e.g., FW400, FW800, etc.), USB (e.g., USB 2.0, 3.0. OTG), Ethernet (e.g., 10/100, 10/100/1000 (Gigabit Ethernet), 10-Gig-E, etc.), InfiniBand, and NVLink families.

As used herein, the term PCIe (Peripheral Component Interconnect Express) refers without limitation to the technology described in PCI-Express Base Specification, Version 1.0a (2003), Version 1.1 (Mar. 8, 2005), Version 2.0 (Dec. 20, 2006), Version 2.1 (Mar. 4, 2009), Version 3.0 (Oct. 23, 2014), Version 3.1 (Dec. 7, 2015), Version 4.0 (Oct. 5, 2017), and Version 5.0 (Jun. 5, 2018), each of the foregoing incorporated herein by reference in its entirety, and any subsequent versions thereof.

As used herein, the term "server" refers to any computerized component, system or entity regardless of form which is adapted to provide data, files, applications, content, or other services to one or more other devices or entities on a computer network.

As used herein, the term "storage" refers to without limitation computer hard drives, DVR device, memory, RAID devices or arrays, SSDs, optical media (e.g., CD-ROMs, Laserdiscs, Blu-Ray, etc.), or any other devices or media capable of storing content or other information.

Overview

The present disclosure describes methods and apparatus for, among other things, providing improved polling of a large number of targets such as for example receive or other types of queues.

In one embodiment, a hardware accelerator card is used to implement a notification mechanism in order to optimize of receive queue polling. A hardware (e.g., FPGA) solution can in certain applications significantly outperform standard software interrupts to implement the proposed mechanism with the CPU, and can be safer than using standard interrupts (in that permissions for unprivileged users can be managed more tightly).

In one embodiment of the present disclosure, data can be efficiently transmitted from a transmitter node (through e.g., a NTB) to a receiver node/host (RX node), and read by the RX node using a notification mechanism and polling. Data is written to a receive queue located in RAM of the RX node, and the index/ID number of the receive queue is written to a notification address (located on an accelerator card BAR of the receive node). The writing to the notification address triggers the accelerator card into examining a notification acknowledgement region (e.g., a notification flag array) to determine whether an entry corresponding to the index number is flagged. If the entry is flagged, no further action is necessary by the hardware process. If the entry is not flagged, the hardware process flags it and writes the index number to a notification ring buffer (located in RAM of the RX node).

In one disclosed configuration, the receive node polling mechanism (poller) periodically checks the notification ring buffer to determine whether it has any entries. If the ring buffer is not empty (i.e., has one or more queue index numbers stored thereon), the poller reads out queue index numbers and scans/processes the receive queue associated with the index numbers. The poller also clears the flags (in the notification flag array) and the notification ring buffer for the queues it has processed.

If the notification ring buffer is determined to be empty, the polling process recognizes that all the receive queues are also empty and ends the polling process.

The accelerator card polling mechanism described above can be implemented in user-space, and is further beneficial in that, rather than having to periodically poll every individual receive queue, the receiver only looks in one place (notification ring buffer) in order to determine if it has any messages (indicated by entries on the ring buffer) and, if yes, where those messages are. A user is therefore advantageously able to determine which (if any) receive queues in a large set of receive queues have data available for processing with very few instructions (i.e., the number of memory accesses required to make this determination grows slowly with the number of receive queues or is constant), and the send size synchronization process is simple and fast.

In another disclosed embodiment, one exemplary polling technique uses a simple array of queue ID flags (array of flags, each corresponding to one or more receive queues) to keep track of the receive queues that have data on them. When a write to a receive queue takes place, the transmitter needs to mark a corresponding flag in the queue ID flag array (i.e., set a flag to 1). A receive node polling mechanism scans the queue ID flags first to determine which receive queues have data on them and then scans the appropriate receive queues (ignoring the empty queues). Although no notification ring buffer and notification address mechanism is present, the receiver is still able to efficiently scan a tightly packed array of flags, instead of scanning every queue. This provides roughly equal (and predictable) latency to all queues. A queue that is receiving data for the first time does not pay any "warm up cost."

Detailed Description of Exemplary Embodiments

Exemplary embodiments of the apparatus and methods of the present disclosure are now described in detail. While these exemplary embodiments are described in the context of PCIe functionality such as that set forth in the PCIe Base Specification e.g., Revision 3.0, 4.0, or later, each incorporated herein by reference in its entirety) and/or certain aspects of PCIe-based systems such as e.g., those set forth in U.S. Pat. Nos. 9,448,957, 9,152,597, 8,868,777, and 8,463,934, each entitled "Unified system area network and switch" and incorporated herein by reference in its entirety, the various aspects of the present disclosure are in no way so limited, and in fact may be used in any number of other applications and/or system architectures or topologies (whether PCIe-based or otherwise), the foregoing being merely exemplary.

Accelerator Card Optimization for Polling

FIGS. 1, 1A-1B, 2, and 2A illustrate an exemplary embodiments of an interconnect fabric transmit and receive operation, including fabric architecture and polling in accordance with aspects of the present disclosure.

FIG. 1 illustrates an exemplary transmit (i.e., write) and notification process performed through an interconnect fabric.

Figure 1A:
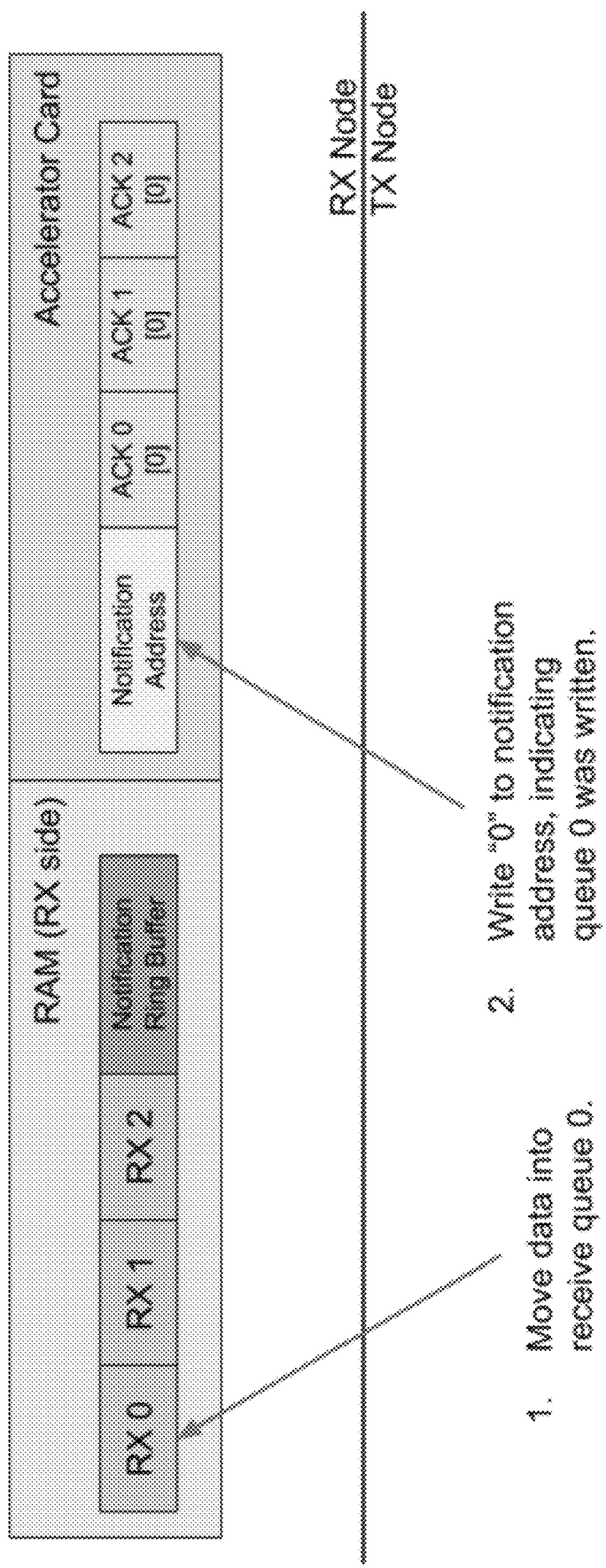
FIG. 1A illustrates an exemplary embodiment of a transmit portion of the process illustrated in FIG. 1, as well as receive node memory and acceleration card architecture which may be used to implement the process.

FIG. 1A illustrates the transmit portion of the process illustrated in FIG. 1, as well as architecture which may be used to implement the process.

Figure 1B:
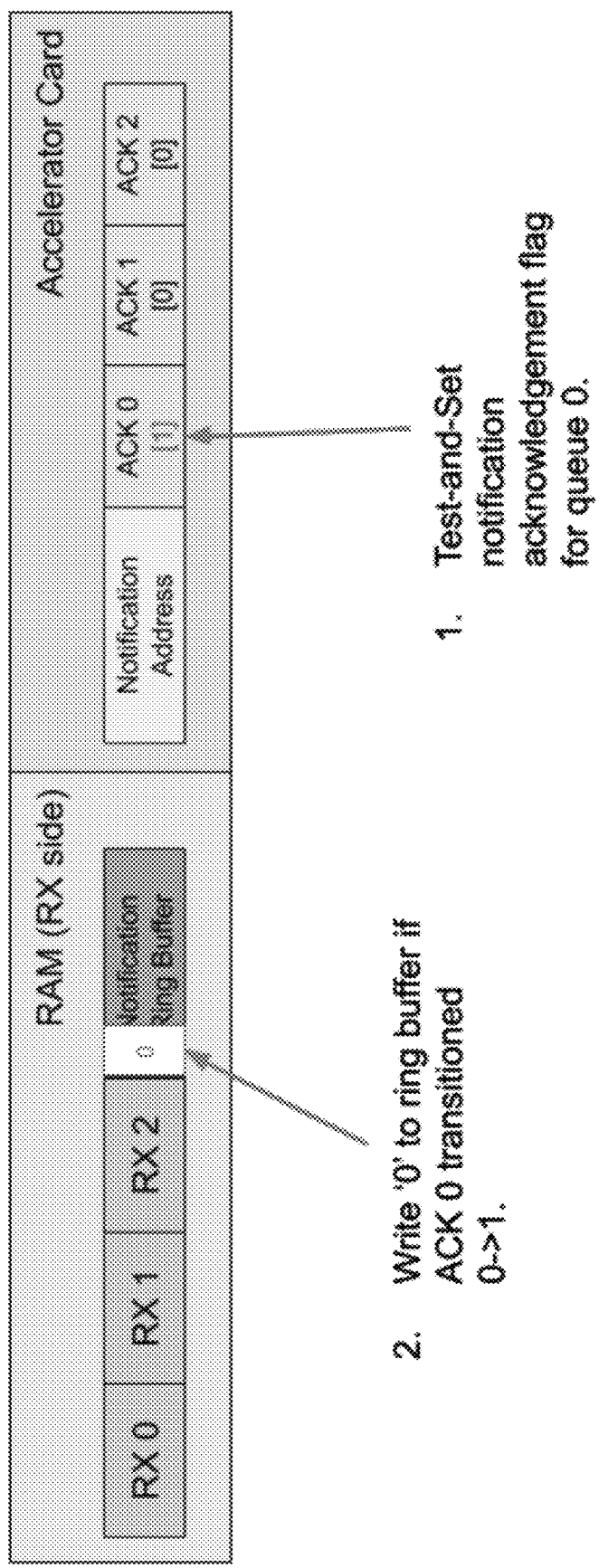
FIG. 1B illustrates an exemplary embodiment of a notification portion of the process of FIG. 1, as well as receive node memory and acceleration card architecture which may be used to implement the process.

FIG. 1B illustrates the notification portion of the process of FIG. 1 (performed in hardware in the exemplary embodiment), which may be performed after the transmit process of FIG. 1A.

In step 102 of the transmitting process 100 of FIG. 1, the transmitter moves data (e.g., through an NTB) to a remote receive queue, which has an associated index of ID (0 in the example of FIG. 1A). The remote receive queue is one of a plurality of receive queues located in the RAM of the receiver host device (RX node). Note that although FIG. 1A shows three receive queues (RX 0, RX 1, RX 2), this is merely for illustrative purposes.

The number of receive queues may be much larger (e.g., in the hundreds or thousands).

In step 104 of the method 100, the transmitter then writes the queue index (i.e., "0") to a notification address which lies within an accelerator card BAR. The notification address is in one implementation a "magic" address, similar to an MSI-X interrupt address, which can be written to across the fabric to signal the availability of data.

In step 106 of the method 100 of FIG. 1, upon receiving a write to the notification address, the hardware (accelerator card) examines the index provided in the write's payload in its notification acknowledgement region (e.g., array having flags ACK 0, ACK 1, ACK 2). If the flag for the given index is 1 (i.e., the flag is already up), no action is taken. If the flag for the given index is 0, then it is set to 1, and an entry is written to the notification ring buffer with the receive queue number (i.e., the write payload).

In the present example, the process finds "0" in the notification address and check the "ACK 0" field (the notification acknowledgement region for queue 0) of the accelerator card. Since the "ACK 0" field is 0 (as shown in FIG. 1A), the hardware the hardware sets the field to 1 and writes "0" to the notification ring buffer located in the RAM of the receiving host device (as shown in FIG. 1B).

In the embodiment described above with respect to FIGS. 1A-1B, the notification acknowledgement region includes an array of notification acknowledgement flags, wherein one flag corresponds to one receive queue (and vice versa).

In another embodiment of the present disclosure, the notification acknowledgement region can include an array of notification acknowledgement flags, such that several receive queues correspond to a single flag. For example, a first flag ACK 2 can correspond to receive queues RX 20 through RX 29, such that writing data to any of RX 29 through RX 29 would necessitate the value of ACK 2 being flipped to 1 (i.e., to indicate the entry is flagged). In this way, various receive queues of the RX node may be logically grouped together within the notification/polling mechanism.

Figure 2:
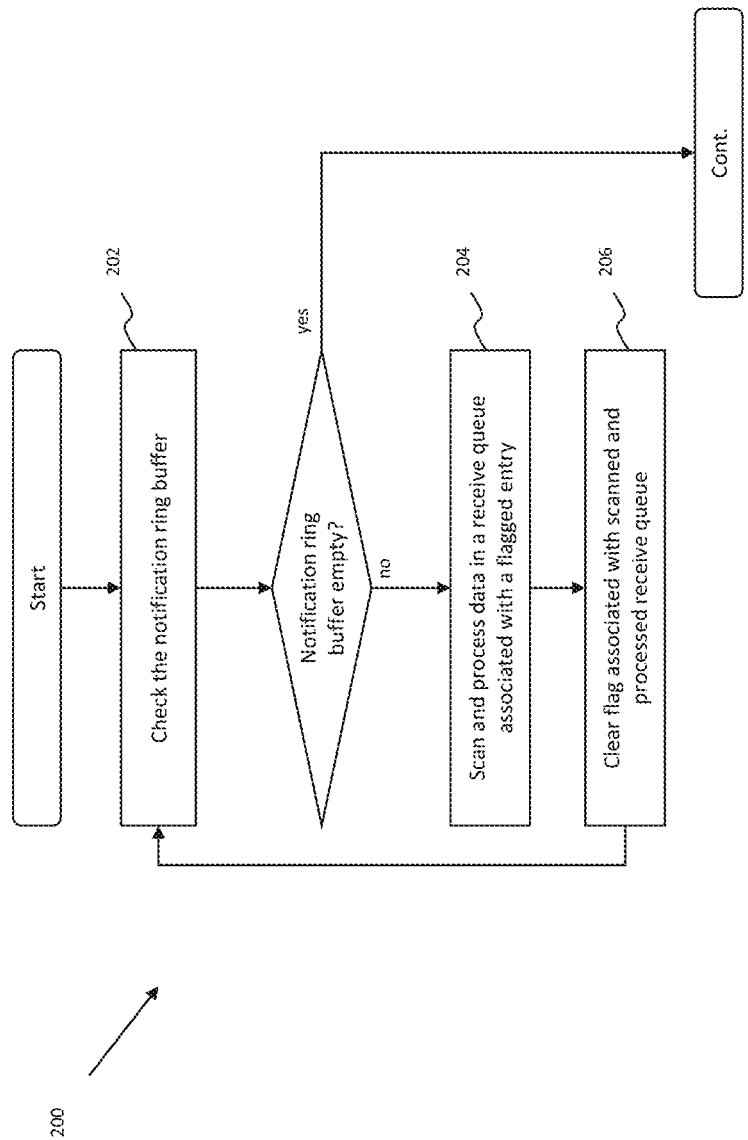
FIG. 2 is a logical flow diagram illustrating one embodiment of a receive process performed using receive queue polling, in accordance with aspects of the present disclosure.

FIG. 2 illustrates one embodiment of a method 200 of polling (i.e., receive process) which may be performed after the process of FIG. 1, in accordance with the present disclosure.

Figure 2A:
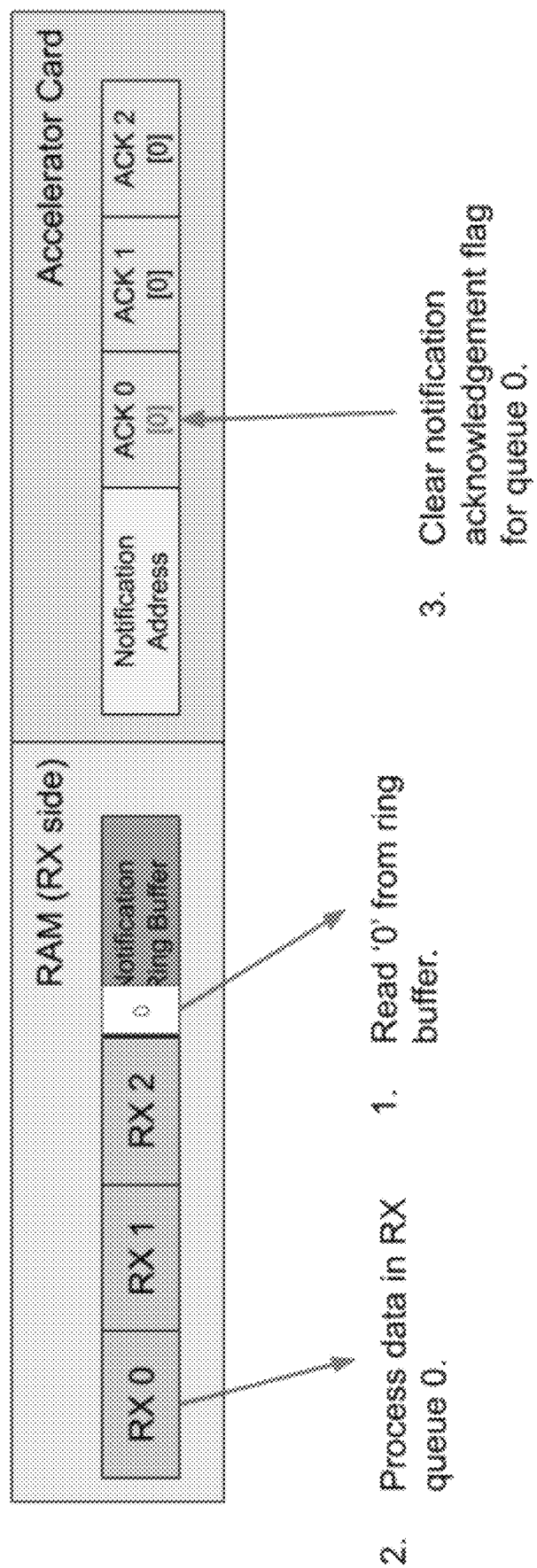
FIG. 2A illustrates an exemplary embodiment of the receive/polling process illustrated in FIG. 2.

FIG. 2A illustrates an exemplary embodiment of the polling process illustrated in FIG. 2.

In step 202 of the method 200, the receiver host poller regularly checks the notification ring buffer for new entries, reading out queue indexes it finds. If the notification ring buffer is empty, the poller may end the process. However, as shown in step 204, upon finding a new entry, the poller removes the entry from the notification ring buffer, scans the associated receive queue and processes all messages present. In the example of FIG. 2A, the poller finds the 0 entry in the notification ring buffer, removes the entry from the notification ring buffer, and processes all data in the RX 0 queue.

In step 206, the poller clears the notification acknowledgement flag for the queue it just processed. As shown in FIG. 2A, the acknowledgment flag "ACK 0" is cleared from 1 back to 0.

After step 206 of the polling process, the poller returns to step 202 in order to check for more entries. Steps 204-206 are repeated until the notification ring buffer is empty. In the example of FIG. 2A, the poller would find the notification ring buffer empty (since the 0 has just been removed) and ends the polling process.

In the embodiments of FIGS. 1-2, an RX node includes one notification ring buffer responsible for all of the receive queues of the RX node, and the accelerator card includes one notification address and a corresponding notification acknowledgement region (a flag array). It will be appreciated, however, that in other embodiments, an RX node may include two or more notification ring buffers, such as where each is responsible for a group/set of receive queues. The receive queues may be grouped using various parameters (e.g., queues may be grouped by priority, set aside for particular types of messages, particular message source ID, etc.). Each notification ring buffer may have a corresponding hardware notification mechanism (including notification address/notification acknowledgement region), implemented on an accelerator card (as in FIGS. 1-2). The hardware notification mechanisms may be included on individual own accelerator cards, or several notification address/region pairs may be included on one accelerator card. Yet other configurations will be recognized by those of ordinary skill when given the present disclosure.

Polling Techniques Using Flag Arrays

In another aspect of the present disclosure, receive queue polling may be improved using an array of queue flags (implemented in software). FIGS. 3A-3D illustrate exemplary embodiments of methods and architectures for performing send/receive operations using arrays of queue flags.

In one embodiment, an array of flags is created and IO mapped, such that each receive (RX) queue has a representative flag. In one configuration, the flags are 8 bytes in size, and the flag array is created inside the host memory.

Figure 3B:
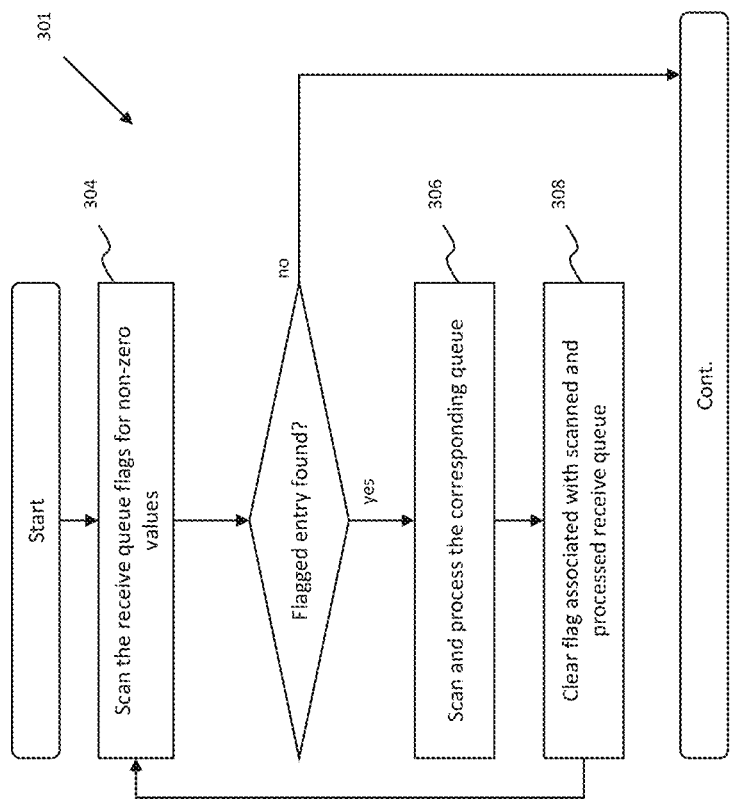
FIG. 3B is a logical flow diagram illustrating another embodiment of a receive/read process performed through an interconnect fabric, in accordance with aspects of the present disclosure.
Figure 3A:
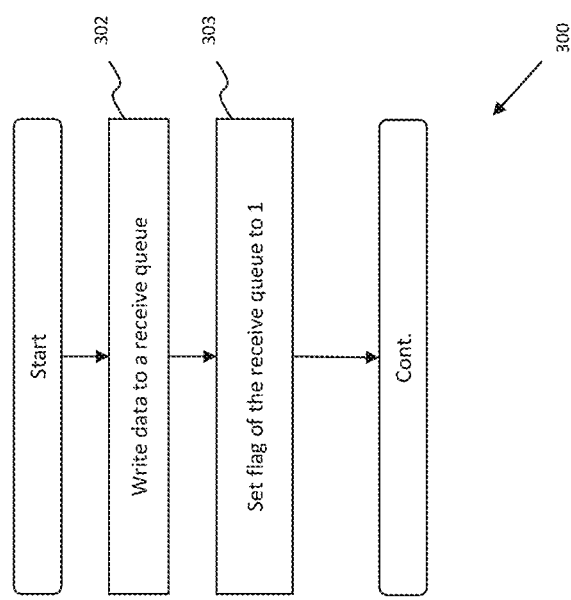
FIG. 3A is a logical flow diagram illustrating another embodiment of a transmit/write process performed through an interconnect fabric, in accordance with aspects of the present disclosure.
Figure 3C:
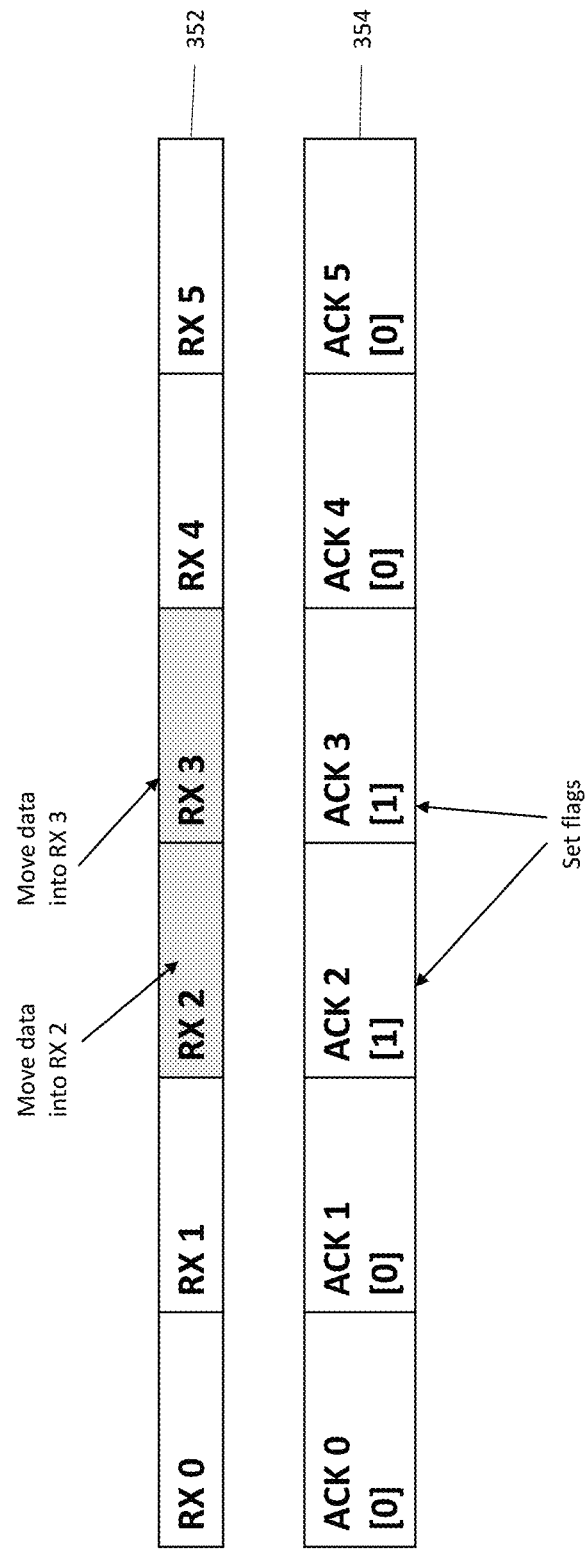
FIG. 3C is a graphical illustration of an embodiment of a receive node memory architecture, including a flag array, according to aspects of the present disclosure.

FIG. 3A shows an exemplary transmit/write process. In steps 302-303 of the method 300, a transmitter sends a message to a queue (step 302) and flags the queue in the flag array (step 303). For example, FIG. 3C illustrates a receive node/host memory (RAM) including receive queues 352 (RX 0 through RX 5) and a flag array 354 having acknowledgement flags (ACK 0 through ACK 5) corresponding to the receive queues. In step 302, a message may be sent to receive queues 2 and 3 (RX 2 and RX 3), and in step 303, corresponding acknowledgement flags (ACK 2 and ACK 3) are changed from 0 to 1.

Figure 3D:
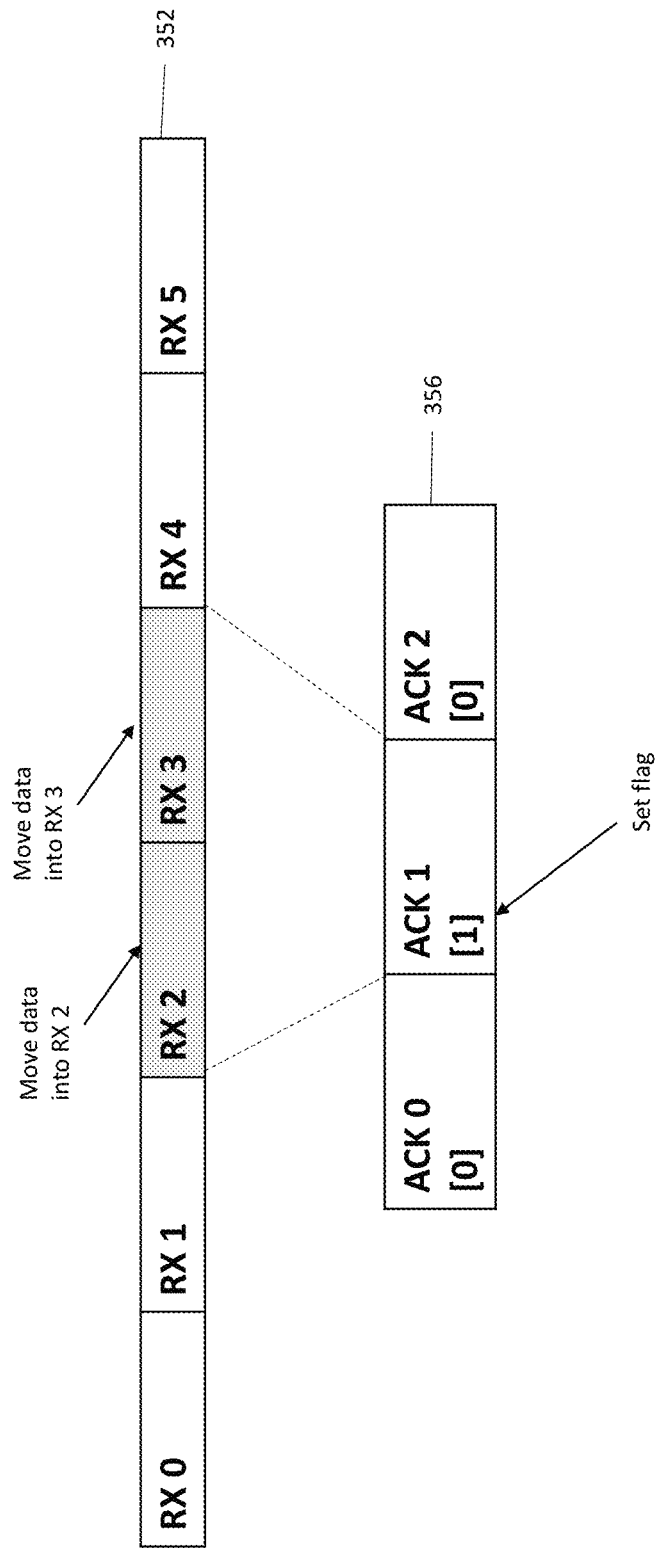
FIG. 3D illustrates another embodiment of receive node memory architecture, including a flag array, according to aspects of the present disclosure.

In another embodiment, several receive queues can share the same flag. For example, FIG. 3D illustrates a flag array 356 in which acknowledgment flag 0 (ACK 0) corresponds to queues 0 and 1, ACK 1 corresponds to queues 2 and 3, and ACK 2 corresponds to queues 4 and 5. In the example of FIG. 3D, a message is written to queues 2 and 3 in step 302, and only flag ACK 1 is set to 1 in step 303. Note that not every flag has to be responsible for the same number of queues, and not every flag has to be responsible for multiple queues. Further, the queues may be grouped according to particular parameters, and grouped queues may share the same flag.

FIG. 3B shows an exemplary message read/poll process 301. In step 304 of the process 301, the receive side scans the array of queue flags 354 (or 356), searching for non-zero values. If no non-zero values are found, the process ends. If a flag with non-zero value is found, the process moves on to step 306, where the corresponding queue is scanned/checked for messages, and the messages are processed. In step 308, the flag of the processed queue is cleared back to zero. Steps 304-308 may be repeated as long as non-zero values remain in the flag array.

Below is a sample of an RX scanning code using the flag array method according to the present disclosure.

```
int next_ready_q = 0;
int ready_qs[KLPP_N_QPS];
uint64_t *fbuf = (uint64_t*)lpp_epp->local_q_flags->flag;
for (int i = 0; i < KLPP_N_QPS / 8; i++, fbuf++) {
    if (__builtin_expect(*fbuf != 0, 0)) {
        uint8_t *b = (uint8_t*)fbuf;
        for (int j = 0; j < 8; j++, b++) {
            if (*b != 0) {
                qn = i * 8 + j;
                ready_qs[next_ready_q] = qn;
                next_ready_q++;
            }
        }
        *fbuf = 0;
    }
}
for (int i = 0; i < next_ready_q; i++) {
    process_q(lpp_epp, ready_qs[i]);
}
```

©Copyright 2019-2020 GigaIO, Inc. All rights reserved.

It will be appreciated that while aspects of the present disclosure are cast in terms of PCIe-based "fabrics" comprised of a plurality of devices interconnected via e.g., cabling or similar physical layer, the aspects of the disclosure may also be applied to other types of applications including, without limitation, memory or other data fabrics or even crossbar technologies, such as for example those utilizing CCIX (Cache Coherent Interconnect for Accelerators) or Gen-Z technology. Specifically, aspects of the present disclosure may be successfully implemented with any applications that include asynchronous read/write operations, and especially with read processes that require polling of large numbers of memory spaces.

It will be recognized that while certain aspects of the disclosure are described in terms of a specific sequence of steps of a method, these descriptions are only illustrative of the broader methods of the disclosure, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the disclosure disclosed and claimed herein.

While the above detailed description has shown, described, and pointed out novel features of the disclosure as applied to various embodiments, it will be understood that various omissions, substitutions, and changes in the form and details of the device or process illustrated may be made by those skilled in the art without departing from the disclosure. This description is in no way meant to be limiting, but rather should be taken as illustrative of the general principles of the disclosure. The scope of the disclosure should be determined with reference to the claims.

It will be further appreciated that while certain steps and aspects of the various methods and apparatus described herein may be performed by a human being, the disclosed aspects and individual methods and apparatus are generally computerized/computer-implemented. Computerized apparatus and methods are necessary to fully implement these aspects for any number of reasons including, without limitation, commercial viability, practicality, and even feasibility (i.e., certain steps/processes simply cannot be performed by a human being in any viable fashion).

What is claimed is:

1. A method of efficiently transmitting data from a plurality of transmit nodes to a receive node, within a computerized system, the method comprising:
writing respective at least a portions of the data to a plurality of receive queues located in a memory of the receive node;
writing index data of the respective receive queues to a common notification address;
based at least on the writing of the index data, evaluating a notification acknowledgement region to determine that entries corresponding to the index data are not flagged; and
based at least on the determination that the entries are not flagged:
flagging the entries; and
writing the index data to a notification ring buffer.

2. The method of claim 1, wherein the computerized system comprises a PCIe (Peripheral Component Interconnect—Express) compliant system comprising a plurality of non-transparent bridges (NTBs) through which the transmitting data from respective ones of the plurality of transmit nodes to the receive node occurs.

3. The method of claim 1, wherein:
the plurality of receive queues number greater than 100; and
the method is configured to respect a prescribed latency for at least the acts of writing at least a portion of the data, writing index data, evaluating, flagging the entry, and writing the index data to the notification ring buffer, collectively.

4. The method of claim 3, wherein the prescribed latency comprises a latency less than 2 ms (milliseconds).

5. The method of claim 1, wherein:
the writing index data comprises writing an ID (identifier) number; and
the notification address comprises an address located within a BAR (base address register) of the receive node.

6. The method of claim 5, wherein the evaluating the notification acknowledgement region comprises evaluating a notification flag array.

7. The method of claim 5, wherein BAR comprises a BAR disposed on a hardware accelerator card.

8. The method of claim 7, wherein: the hardware accelerator card comprising an FPGA (field programmable gate array) having a plurality of reconfigurable hardware logic gates; and the computerized system comprises a plurality of receive queues, including the receive queue, which number greater than 1000; and the method is configured to respect a prescribed latency for at least the acts of writing at least a portion of the data, writing index data, evaluating, flagging the entry, and writing the index data to the notification wring buffer, collectively; and wherein the prescribed latency is respected based at least on use of the plurality of reconfigurable hardware logic gates.

9. The method of claim 1, wherein the method is at least partly implemented in user space, and obviates having to periodically poll all receive queues within the computerized system.

10. Computer readable apparatus comprising a storage medium, the storage medium comprising at least one computer program configured to, when executed on a digital processing apparatus of a computerized system:
receive data at a receive node of the computerized system;
write at least a portion of the data to a receive queue located in a memory of the receive node;
write index data of the receive queue to a notification address;
based at least on the writing of the index data, cause evaluation of a notification acknowledgement region to determine whether an entry corresponding to the index data is not flagged; and
based at least on the determination that the entry is not flagged:
flag the entry; and
write the index data to a notification ring buffer; or
based at least on the determination that the entry is flagged, enter a wait state for at least a period of time.

11. The Computer readable apparatus of claim 10, wherein the computerized system comprises a PCIe (Peripheral Component Interconnect—Express) compliant system comprising at least one non-transparent bridge (NTB) via which the receiving data at the receive node occurs.

12. A computerized node for use in a multi-node system, the multi-node system comprising a plurality of nodes each comprising one or more non-transparent bridges (NTBs), the one or more non-transparent bridges in data communication with one another via a data fabric of the multi-node system, the computerized node comprising:
at least one data interface;
digital processor apparatus in data communication with the at least one interface;
storage apparatus in data communication with the digital processor apparatus, the storage apparatus comprising a ring buffer; and
computerized logic in data communication with the digital processor apparatus and configured to implement a polling process, the polling process configured to:
check the ring buffer to determine whether any queue index data is present within the ring buffer, the queue index data associated with one or more of the plurality of nodes which have transmitted message data to the computerized node; and
based at least on the presence, during said check, of one or more queue index data values present within the ring buffer:
read out the one or more queue index data values; and
process a respective receive queue associated with each of the one or more queue index data values.

13. The computerized node of claim 12, wherein the polling process is also configured to clears one or more flags in a notification flag array and the ring buffer for those of the respective queues it has processed.

14. The computerized node of claim 12, wherein the polling process is implemented in user-space.

15. The computerized node of claim 12, wherein the computerized logic is configured such that the check of the ring buffer is performed periodically; and
wherein the polling process and ring buffer cooperate to obviate polling of a plurality of queues of at least one of the computerized node or the multi-node system which do not require processing on each of a plurality of the periodic checks.

16. A computerized method of polling a plurality of message queues within a computerized system, the method comprising:
establishing an array of queue flags, each of the flags corresponding to one or more of the message queues, the flags each configured to indicate one or more message queues that have message data, the message queues each comprising at least one identifier;

based at least on a write of data to a one of the message queues, setting a flag associated with the one message queue in the array of queue flags, and (ii) writing the at least one identifier to a notification address;

scanning the array of queue flags to determine which of the message queues have data; and based at least on the scanning, reading data from only the message queues having data.

17. The computerized method of claim 16, wherein at least the establishing the array of queue flags, and the scanning of the array, produces an approximately equal and predictable latency for all of the message queues.

18. The computerized method of claim 16, wherein the writing the at least one identifier to a notification address further comprises causing the receiving device to perform evaluation of the array of queue flags to determine whether the flag associated with the one message queue is already set as part of said setting.

19. The computerized method of claim 16, wherein the computerized system comprises:

a plurality of transmitting nodes; and a receiving node common to each of the plurality of transmitting nodes; and wherein the plurality of transmitting nodes are in data communication with the receiving node via at least an NTB (non-transparent bridge) based data network fabric.

20. The computerized method of claim 19, wherein the writing the at least one identifier to a notification address comprises writing, by a one of the plurality of transmitting nodes writing the data to the one of the message queues, the at least one identifier to a same BAR (base address register) space of the common receiving device that is used for writing respective at least one identifiers associated with others of the plurality of message queues.

21. A computerized method of operating a computerized system comprising a plurality of message transmitting nodes and a message receiving node, the plurality of message transmitting nodes in data communication with the message receiving node via a non-transparent bridge (NTB) based data fabric, the method comprising:

transmitting, from each of the plurality of message transmitting nodes, a data message;

receiving each of the transmitted data messages at a respective at least one message queue;

writing respective identifier data useful for identification of each of the at least one message queues to a common notification address associated with the message receiving node;

configuring an array of queue flags, each of the flags corresponding to one or more of the at least one message queues, the flags each configured to indicate the presence of message data; and based at least on scanning of the array of queue flags to determine which of the message queues have data, reading, via the message receiving node, message data from only the message queues having message data.

22. The computerized method of claim 21, wherein:

the transmitting of plurality of transmitted data messages comprises transmitting the plurality of data messages from their respective message transmitting nodes asynchronously; and the method further comprises:

serializing the plurality of transmitted data messages using at least a ring buffer; and processing the serialized plurality of transmitted data messages at the receiving node by reading the ring buffer in serial fashion.

* * * * *